US011521688B2

(12) United States Patent
Lu et al.

(10) Patent No.: US 11,521,688 B2
(45) Date of Patent: Dec. 6, 2022

(54) POWER REDUCTION DURING OPEN AND ERASED BLOCK READS OF MEMORY BASED ON THE POSITION OF LAST WRITTEN WORD LINE OF A MEMORY BLOCK

(71) Applicant: Western Digital Technologies, Inc., San Jose, CA (US)

(72) Inventors: Nan Lu, San Jose, CA (US); Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/173,805

(22) Filed: Feb. 11, 2021

(65) Prior Publication Data

US 2022/0122672 A1    Apr. 21, 2022

Related U.S. Application Data

(60) Provisional application No. 63/094,411, filed on Oct. 21, 2020.

(51) Int. Cl.
| | |
|---|---|
| *G11C 16/08* | (2006.01) |
| *G11C 16/16* | (2006.01) |
| *G11C 16/26* | (2006.01) |
| *G11C 16/34* | (2006.01) |
| *G11C 16/30* | (2006.01) |

(52) U.S. Cl.
CPC .............. *G11C 16/16* (2013.01); *G11C 16/08* (2013.01); *G11C 16/26* (2013.01); *G11C 16/30* (2013.01); *G11C 16/3422* (2013.01)

(58) Field of Classification Search
CPC ......... G11C 16/16; G11C 16/08; G11C 16/26; G11C 16/30; G11C 16/3422
See application file for complete search history.

(56) References Cited

U.S. PATENT DOCUMENTS

| | | | |
|---|---|---|---|
| 9,449,700 B2 * | 9/2016 | Shah | G11C 16/34 |
| 9,671,968 B2 | 6/2017 | Kasorla et al. | |
| 9,792,998 B1 * | 10/2017 | Yang | G11C 16/08 |
| 9,805,807 B2 | 10/2017 | Lee et al. | |
| 9,978,456 B2 * | 5/2018 | Khandelwal | G11C 16/26 |
| 11,037,635 B1 * | 6/2021 | Lien | G11C 11/5628 |
| 2014/0003147 A1 * | 1/2014 | Dutta | G11C 11/5635 |
| | | | 365/185.11 |
| 2019/0304549 A1 | 10/2019 | Yang et al. | |
| 2019/0318787 A1 | 10/2019 | Lee et al. | |
| 2019/0333588 A1 | 10/2019 | Yang et al. | |
| 2020/0005878 A1 * | 1/2020 | Lu | G11C 16/26 |

* cited by examiner

*Primary Examiner* — Mushfique Siddique
(74) *Attorney, Agent, or Firm* — Michael Best & Friedrich LLP

(57) ABSTRACT

A data storage device including, in one implementation, a non-volatile memory and a controller. The non-volatile memory includes a memory block. The memory block includes a plurality of word lines that are written sequentially from a first end of the memory block to a second end of the memory block. The controller is coupled to the non-volatile memory. The controller is configured to determine a last written word line of the memory block. The controller is also configured to set a non-selected word line voltage based on the last written word line of the memory block. The controller is further configured to apply the non-selected word line voltage to non-selected word lines of the memory block.

22 Claims, 3 Drawing Sheets

POWER REDUCTION DURING OPEN AND ERASED BLOCK READS OF MEMORY BASED ON THE POSITION OF LAST WRITTEN WORD LINE OF A MEMORY BLOCK

CROSS-REFERENCE TO RELATED APPLICATION

This application claims priority to and the benefit of U.S. Provisional Patent Application No. 63/094,411, filed on Oct. 21, 2020, the entire contents of which is incorporated herein by reference.

BACKGROUND

This application relates generally to memory devices, and more particularly, to a controller that reduces non-selected word line voltage in memory devices based on word line load.

Most reads are performed on fully-programmed blocks of memory (i.e., closed blocks). However, some reads are performed on blocks of memory that are partially-programmed and partially-erased (i.e., open blocks). Further, some reads are performed on blocks that are fully-erased (i.e., erased blocks). Open blocks may be read, for example, during host reads, relocation reads, and find last good page ("FLGP") detections. Erased blocks may be read, for example, during ungraceful shutdown ("UGSD") recoveries and FLGP detections. The supply current applied during open block reads is higher than during closed block reads (for example, about 20% higher on average). In addition, the supply current applied during erased block reads is significantly higher than during closed block reads (for example, up to about 60% higher).

SUMMARY

A voltage is applied to non-selected word lines of blocks when reading selected word lines. This voltage (referred to herein as a "non-selected word line voltage" or a "Vread voltage") can be reduced based on the number of programmed word lines in a specific block. In a sequentially-programmed block, the number of programmed word lines can be determined based on the last written word line. Accordingly, the present disclosure provides data storage devices, methods, and apparatuses that, among other things, reduce the non-selected word line voltage based on the last written word line of a memory block.

For example, the present disclosure provides a data storage device including a non-volatile memory and a controller. The non-volatile memory includes a memory block. The memory block includes a plurality of word lines that are written sequentially from a first end of the memory block to a second end of the memory block. The controller is coupled to the non-volatile memory. The controller is configured to determine a last written word line of the memory block. The controller is also configured to set a non-selected word line voltage based on the last written word line of the memory block. The controller is further configured to apply the non-selected word line voltage to non-selected word lines of the memory block.

The present disclosure also provides a method performed by a controller coupled to a non-volatile memory. The method includes determining a last written word line of a memory block included in the non-volatile memory. The memory block includes a plurality of word lines that are written sequentially from a first end of the memory block to a second end of the memory block. The method also includes setting a non-selected word line voltage based on the last written word line of the memory block. The method further includes applying the non-selected word line voltage to non-selected word lines of the memory block.

The present disclosure further provides an apparatus including means for determining a last written word line of a memory block included in a non-volatile memory. The memory block includes a plurality of word lines that are written sequentially from a first end of the memory block to a second end of the memory block. The apparatus also includes means for setting a non-selected word line voltage based on the last written word line of the memory block. The apparatus further includes means for applying the non-selected word line voltage to non-selected word lines of the memory block.

Various aspects of the present disclosure provide for improvements in memory devices. For example, reducing the non-selected word line voltage based on the last written word of a memory block as described herein, among other things, reduces peak and average supply current during reads on open blocks and erased blocks without negatively impacting performance. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller may be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc.

Figure 1:
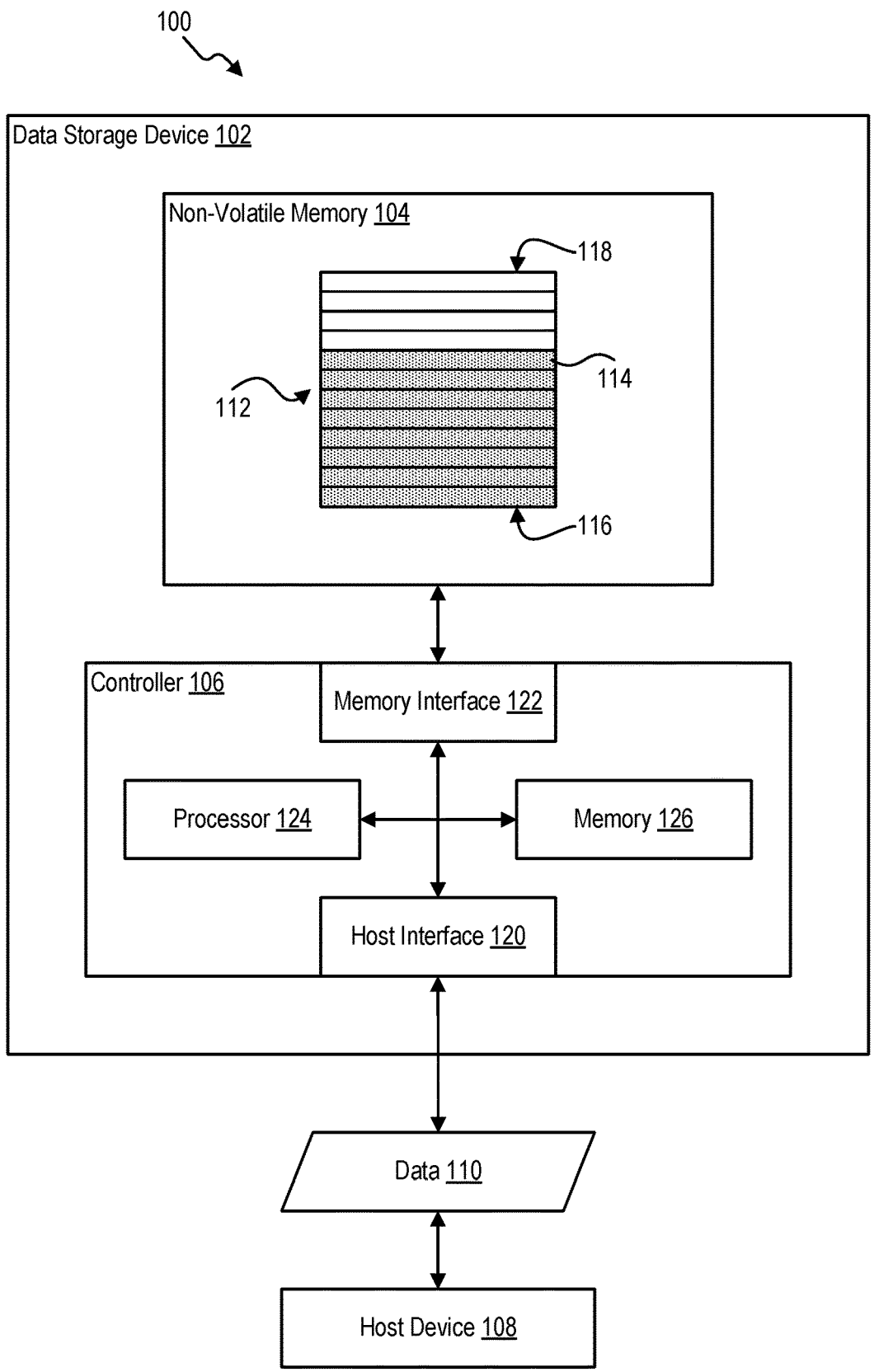
FIG. 1 is block diagram of one example of a system including a data storage device, in accordance with some implementations of the present disclosure.

FIG. 1 is block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a non-volatile memory 104 and a controller 106. The data storage device 102 is coupled to a host device 108. The host device 108 is configured to provide data 110 (for example, user data) to the data storage device 102 to be stored, for example, in the non-volatile memory 104. The host device 108 is also configured to request data 110 to be read from the non-volatile memory 104. The host device 108 is, for example, a smart phone, a music player, a video player, a gaming console, an e-book reader, a personal digital assistance, a tablet, a notebook computer, or another similar device.

The non-volatile memory 104 of the data storage device 102 is coupled to the controller 106. In some implementations, the non-volatile memory 104 is NAND flash memory. The non-volatile memory 104 illustrated in FIG. 1 includes a memory block 112. The non-volatile memory 104 is illustrated in FIG. 1 in a simplified form. One skilled in the art would recognize that a non-volatile memory would include additional memory blocks. The memory block 112 includes a plurality of word lines. For example, in FIG. 1, the memory block 112 includes a representative word line 114. Each word line includes a plurality of storage elements. In some implementations, each storage element is a multi-level cell ("MLC") flash memory cell, such as a four bits per cell ("4BPC") flash memory cell. In other implementations, each storage element is a single level cell ("SLC") flash memory cell, a two bits per cell ("2BPC") flash memory cell, a three bits per cell ("3BPC") flash memory cell, or a flash memory cell having a larger number of bits per cell (for example, between five and ten bits per cell). The word lines are programmed sequentially from a first end 116 of the memory block 112 to a second end 118 of the memory block 112. Programmed word lines in the memory block 112 illustrated in FIG. 1 are shaded. Erased word lines in the memory block 112 illustrated in FIG. 1 are unshaded.

The controller 106 illustrated in FIG. 1 includes a host interface 120, a memory interface 122, a processor 124 (for example, a microprocessor, a microcontroller, a field-programmable gate array ["FPGA"] semiconductor, an application specific integrated circuit ["ASIC"], or another suitable programmable device), and a memory 126 (for example, a random access memory ["RAM"], a read-only memory ["ROM"], a non-transitory computer readable medium, or a combination thereof). The controller 106 is illustrated in FIG. 1 in a simplified form. One skilled in the art would recognize that a controller for a non-volatile memory may include additional modules or components other than those specifically illustrated in FIG. 1. Additionally, although the data storage device 102 is illustrated in FIG. 1 as including the controller 106, in other implementations, the controller 106 is instead located within the host device 108 or is otherwise separate from the data storage device 102. As a result, operations that would normally be performed by the controller 106 (for example, wear leveling, bad block management, data scrambling, garbage collection, address mapping, etc.) can be performed by the host device 108 or another device that connects to the data storage device 102.

The controller 106 is configured to send data to, and receive data and instructions from, the host device 108 via the host interface 120. The host interface 120 enables the host device 108 to, for example, read from the non-volatile memory 104 and to write to the non-volatile memory 104 using any suitable communication protocol. Suitable communication protocols include, for example, the Universal Flash Storage ("UFS") Host Controller Interface specification, the Secure Digital ("SD") Host Controller specification, etc.

The controller 106 is also configured to send data and commands to, and receive data from, the non-volatile memory 104 via the memory interface 122. As an illustrative example, the controller 106 is configured to send data and a write command to instruct the non-volatile memory 104 to store data in a particular memory location in the non-volatile memory 104. The controller 106 is also configured to send a read command to the non-volatile memory 104 to read data from a particular memory location in the non-volatile memory 104.

The processor 124 is operatively connected to the various modules within the controller 106 and the data storage device 102. For example, firmware is loaded in a ROM of the memory 126 as computer executable instructions. Those computer executable instructions are capable of being retrieved from the memory 126 and executed by the processor 124 to control the operation of the controller 106 and perform the processes described herein. In some implementations, one or more modules of the controller 106 correspond to separate hardware components within the controller 106. In other implementations, one or more modules of the controller 106 correspond to software stored within the memory 126 and executed by the processor 124. The memory 126 is configured to store data used by the controller 106 during operation.

When reading one or more selected word lines of a block of memory, a non-selected word line voltage (also known as a "Vread voltage") is applied to every non-selected word line of the block to turn-on all the memory cells and avoid channel cutoff. Current memory systems assume that all word lines are always written, and thus apply a fixed Vread voltage during a read operation. The fixed Vread voltage is designed to provide a margin over the memory cell voltage threshold with the highest G state. For example, the Vread voltage may be fixed at 8 volts to provide a margin of 2 volts when the cell voltage threshold with the highest G state is 6 volts. The resistance of an erased word line is less than the resistance of a programmed word line. Thus, in accordance with Ohm's law, the supply current increases when a fixed Vread voltage is applied during open block reads and erased block reads.

Figure 2A:
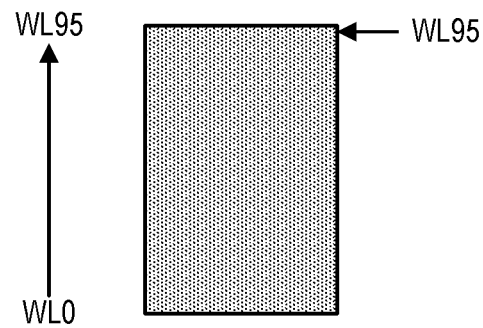
FIG. 2A is a diagram of one example of a closed block of memory.
Figure 2B:
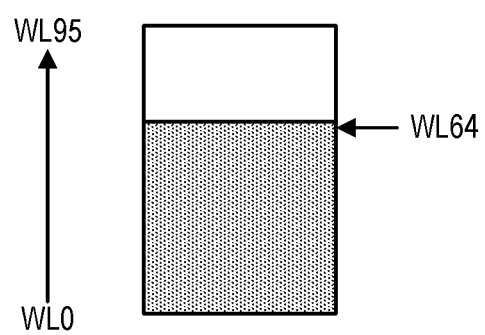
FIGS. 2B and 2C are diagrams of two examples of open blocks of memory.

The amount of voltage needed to turn-on non-selected word lines is substantially monotonically related to the overall resistance of all word lines in a block of memory. Thus, the non-selected word line voltage can be reduced when some of the word lines in a block are erased. FIGS. 2A through 2D are diagrams of examples of blocks with different word line loads. Programmed word lines are indicated in FIGS. 2A through 2D by shading and erased word lines are indicated by a lack of shading. FIG. 2A is diagram of an example of a closed block in which every word line is programmed. FIG. 2B is a diagram of a first example of an open block in which some of the word lines are erased. The overall resistance of the open block in FIG. 2B is lower than the overall resistance of the closed block in FIG. 2A because it has more erased word lines. Thus, a lower non-selected word line voltage can be applied to the open block in FIG.

Figure 2C:
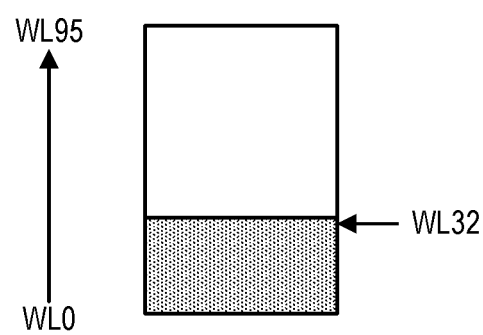
Figure 2D:
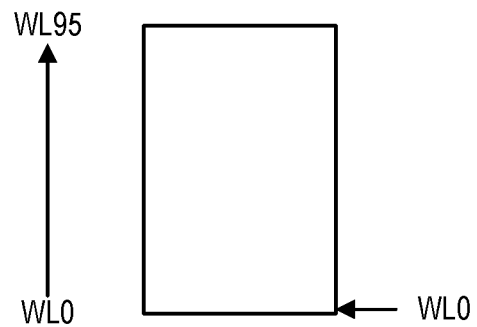
FIG. 2D is a diagram of one example of an erased block of memory.

2B. For example, a non-selected word line voltage of 6.6 volts can be applied to the open block in FIG. 2B whereas a non-selected word line voltage of 8 volts is needed for the closed block in FIG. 2A. FIG. 2C is a diagram of a second example of an open block in which some of the word lines are erased. The overall resistance of the open block in FIG. 2C is lower than the overall resistance of the open block in FIG. 2B because it has more erased word lines. Thus, a lower non-selected word line voltage can be applied to the open block in FIG. 2C. For example, a non-selected word line voltage of 5.2 volts can be applied to the open block in FIG. 2C. FIG. 2D is a diagram of an example of an erased block in which all of the word lines are erased. The overall resistance of the erased block in FIG. 2D is lower than the overall resistance of the open block in FIG. 2C because it has more erased word lines. Thus, a lower non-selected word line voltage can be applied to the erased block in FIG. 2D. For example, a non-selected word line voltage of 3.8 volts can be applied to the closed block in FIG. 2D. Summarizing the above, the non-selected word line voltage can be reduced based on word line load (i.e., the number of programmed word lines in a block of memory).

In a sequentially-programmed block, the number of programmed word lines can be determined based on the last written word line. For example, the last written word line of the closed block in FIG. 2A is word line 95 and the closed block in FIG. 2A includes 96 programmed word lines. As a further example, the last written word line of the open block in FIG. 2B is word line 64 and the open block in FIG. 2B includes 65 programmed word lines. As an additional example, the last written word line of the open block in FIG. 2C is word line 32 and the open block in FIG. 2C includes 33 word lines. Given the substantially monotonic relationship between last written world line and word line load, the non-selected word line voltage can be reduced based on the last written word line of a block of memory.

Returning to the data storage device 102 illustrated in FIG. 1, the controller 106 is configured to set the non-selected word line voltage based on the last written word line of the memory block 112. In some implementations, the word lines of the memory block 112 are divided into a plurality of zones based on the word lines filled out, and each of the plurality of zones is assigned a different, predetermined non-selected word line voltage. For example, assuming the memory block 112 includes 96 total word lines, the controller 106 may set the non-selected word line voltage to 8 volts when the last written word line of the memory block 112 is positioned between word line 95 (i.e., the second end 118 of the memory block 112) and word line 64 (an example of a "first predetermined word line"). Further, the controller 106 may set the non-selected word line voltage to 6.6 volts when the last written word line of the memory block 112 is positioned between word line 64 and word line 32 (an example of a "second predetermined word line"). Additionally, the controller 106 may set the non-selected word line voltage to 5.2 volts when the last written word line of the memory block 112 is positioned between word line 32 and word line 0 (i.e., the first end 116 of memory block 112). In some implementations, the word lines of the memory block 112 are divided into three zones as in the example described above. In other implementations, the word lines of the memory block 112 are divided into more than three zones.

In some implementations, the controller 106 is configured to set the non-selected word line voltage based at least in part on a predetermined monotonic relationship (for example, a predetermined linear relationship) between the non-selected word line voltage and a position of the last written word line of the memory block 112. For example, the controller 106 may set the non-selected word line voltage according the following equation:

$$V_{read} = (m \times LWL)^a + b \qquad \text{Equation (1)}$$

where:
$V_{read}$=non-selected word line voltage,
m=predetermined slope value representing the relationship between the non-selected word line voltage and a position of the last written word line of the memory block 112,
LWL=last written word line of the memory block 112,
a=predetermined power value representing the relationship between the non-selected word line voltage and a position of the last written word line of the memory block 112, and
b=predetermined offset value.

The non-selected word line voltage can be reduced during the beginning of life ("BOL") of the memory block 112. Thus, in some implementations, the controller 106 is configured to decrease the non-selected word line voltage by a predetermined amount when the program-erase cycle count of the memory block 112 is less than a threshold. For example, the controller 106 may decrease the non-selected word line voltage by a predetermined amount when the program-erase cycle count of the memory block 112 is less than 1.5K.

The resistance of word lines decreases as temperatures increases. Thus, in some implantations, the controller 106 is configured to decrease the non-selected word line voltage by a predetermined amount when a temperature of the memory block 112 is greater than a threshold. For example, the controller 106 may decrease the non-selected word line voltage by a predetermined amount when the temperature of the memory block 112 is higher than 30 degrees Celsius.

In some implementations, the controller 106 is configured to apply the same non-selected word line voltage to all non-selected word line in the memory block 112. In other implementations, the controller 106 is configured to apply different non-selected word line voltages to programmed non-selected word lines and erased non-selected word lines. As described above, the resistance of an erased word line is lower than the resistance of a programmed word line. Thus, the controller 106 may apply a non-selected erased word line voltage to erased non-selected word lines that is lower than the non-selected programmed word line voltage applied to programmed non-selected word lines. For example, the controller 106 may apply a non-selected programmed word line voltage of 5 volts to programmed non-selected word lines and a non-selected erased word line voltage of 1 volt to erased non-selected word lines.

The controller 106 can determine which non-selected word lines are programmed and which non-selected word lines are erased using the last written word line because the memory block 112 is sequentially-programmed. For example, if the word line 114 illustrated in FIG. 1 is the last written word line, then the non-selected word lines positioned between the first end 116 of the memory block 112 and the word line 114 are programmed and the non-selected word lines positioned between the word line 114 and the second end 118 of the memory block 112 are erased. Thus, the controller 106 may apply a non-selected programmed word line voltage to non-selected word lines positioned between the first end 116 of the memory block 112 and the last written word line and a non-selected erased word line voltage (i.e., a lower voltage) to non-selected word lines between the last written word line and the second end 118 of the memory block 112. In some implementations, the non-selected programmed word line voltage is set by the controller 106 based on the last written word line, as described above, and the non-selected erased word line voltage is a fixed, predetermined voltage. For example, the non-selected erased word line voltage may be fixed at 0.5 volts.

Figure 3:
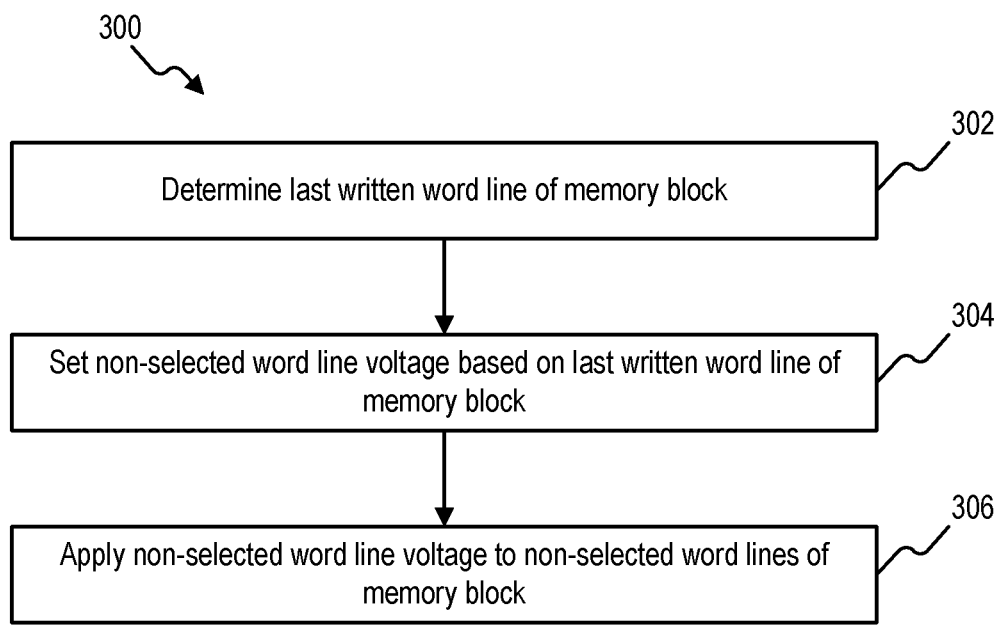
FIG. 3 is a flow diagram of an example of a method for reducing non-selected word line voltage based on the last written word line of a memory block, in accordance with some implementations of the present disclosure.

FIG. 3 is a flow diagram of one example of a method 300 for reducing non-selected word line voltage based on the last written word line of a memory block. At block 302, a last written word line of a memory block is determined. For example, the last written word line of the memory block 112 may be recorded during a graceful shutdown ("GSD") of the non-volatile memory 104 or a power loss protection ("PLP") in an ungraceful shutdown ("UGSD") of the non-volatile memory 104. The controller 106 may store the recorded last written word line of the memory block 112, for example, in the memory 126. Alternatively, the controller 106 may query the non-volatile memory 104 to obtain the recorded last written word line of the memory block 112.

At block 304, a non-selected word line voltage is set based on the last written word line of the memory block. For example, the controller 106 sets the non-selected word line voltage based on the last written word line of the memory block 112 using one (or any combination) of the different methods described above. At block 306, the non-selected word line voltage is applied to non-selected word lines of the memory block. For example, the controller 106 may send a control signal to the non-volatile memory 104 indicating the non-selected word line voltage that the non-volatile memory 104 should apply to the non-selected word lines of the memory block 112. Alternatively, the controller 106 may directly apply the non-selected word line voltage to the non-selected word lines of the memory block 112.

In connection with the disclosed implementations, an apparatus includes means for determining a last written word line of a memory block included in a non-volatile memory. The means for determining the last written word line of the memory block may correspond, for example, to the non-volatile memory 104, the controller 106, or a combination of the two. The apparatus also includes means for setting a non-selected word line voltage based on the last written word line of the memory block. The means for setting the non-selected word line voltage based on the last written word line of the memory block may correspond, for example, to the controller 106. The apparatus also includes means for applying the non-selected word line voltage to non-selected word lines of the memory block. The means for applying the non-selected word line voltage to non-selected word lines of the memory block may correspond, for example, to the non-volatile memory 104, the controller 106, or a combination of the two.

In some implementations, the means for the setting the non-selected word line voltage based on the last written word line of the memory block is further configured to set the non-selected word line voltage to a first predetermined voltage when the last written word line of the memory block is positioned between the second end of the memory block and a first predetermined word line of the memory block, set the non-selected word line voltage to a second predetermined voltage when the last written word line of the memory block is positioned between the first predetermined word line of the memory block and a second predetermined word line of the memory block, and set the non-selected word line voltage to a third predetermined voltage when the last written word line of the memory block is positioned between the second predetermined word line of the memory block and the first end of the memory block. The second predetermined voltage is less than the first predetermined voltage. The third predetermined voltage is less than the second predetermined voltage.

In some implementations, the apparatus also includes means for decreasing the non-selected word line voltage by a predetermined amount when a program-erase cycle count of the memory block is less than a threshold. The means for decreasing the non-selected word line voltage by a predetermined amount when a program-erase cycle count of the memory block is less than a threshold may correspond, for example, to the controller 106.

In some implementations, the apparatus also includes means for decreasing the non-selected word line voltage by a predetermined amount when a temperature of the memory block is greater than a threshold. The means for decreasing the non-selected word line voltage by a predetermined amount when a temperature of the memory block is greater than a threshold may correspond, for example, to the controller 106.

In some implementations, the means for the setting the non-selected word line voltage based on the last written word line of the memory block is further configured to set the non-selected word line voltage based at least in part on a predetermined monotonic relationship between the non-selected word line voltage and a position of the last written word line of the memory block.

In some implementations, the apparatus also includes means for applying a non-selected programmed word line voltage to non-selected word lines of the memory block positioned between the first end of the memory block and the last written word line of the memory block, and means for applying a non-selected erased word line voltage to non-selected word lines of the memory block positioned between the last written word line of the memory block and the second end of the memory block. The means for applying the non-selected programmed word line voltage may correspond to, for example, to the non-volatile memory 104, the controller 106, or a combination of the two. The means for applying the non-selected erased word line voltage may correspond to, for example, to the non-volatile memory 104, the controller 106, or a combination of the two. The non-selected erased word line voltage is less than the non-selected programmed word line voltage.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a NAND flash memory including a memory block, the memory block including a plurality of word lines that are written sequentially from a first end of the memory block to a second end of the memory block; and
a controller circuitry coupled to the NAND flash memory and configured to:
determine a last written word line of the memory block,
set a non-selected word line voltage based on a position of the last written word line between the first end and the second end of the memory block, and
control the non-selected word line voltage to be applied to non-selected word lines of the memory block.

2. The data storage device of claim 1, wherein, to set the non- selected word line voltage based on the position of the last written word line of the memory block, the controller is further configured to:
set the non-selected word line voltage to a first predetermined voltage when the last written word line of the memory block is positioned between the second end of the memory block and a first predetermined word line of the memory block,
set the non-selected word line voltage to a second predetermined voltage when the last written word line of the memory block is positioned between the first predetermined word line of the memory block and a second predetermined word line of the memory block, and
set the non-selected word line voltage to a third predetermined voltage when the last written word line of the memory block is positioned between the second predetermined word line of the memory block and the first end of the memory block,
wherein the second predetermined voltage is less than the first predetermined voltage, and wherein the third predetermined voltage is less than the second predetermined voltage.

3. The data storage device of claim 1 2, wherein the controller is further configured to cause a decrease of the non-selected word line voltage by a predetermined amount when a program-erase cycle count of the memory block is less than a threshold.

4. The data storage device of claim 1 2, wherein the controller is further configured to cause a decrease of the non-selected word line voltage by a predetermined amount when a temperature of the memory block is greater than a threshold.

5. The data storage device of claim 1, wherein, to set the non-selected word line voltage based on the position of the last written word line of the memory block, the controller is further configured to set the non-selected word line voltage based at least in part on a predetermined monotonic relationship between the non-selected word line voltage and the position of the last written word line of the memory block.

6. The data storage device of claim 1, wherein the non-selected word line voltage is a non-selected programmed word line voltage, wherein the controller is further configured to:
control the non-selected programmed word line voltage to be applied to non-selected word lines of the memory block positioned between the first end of the memory block and the last written word line of the memory block, and
control a non-selected erased word line voltage to be applied to non-selected word lines of the memory block positioned between the last written word line of the memory block and the second end of the memory block,
wherein the non-selected erased word line voltage is less than the non-selected programmed word line voltage.

7. The data storage device of claim 6, wherein the controller is further configured to set the non-selected erased word line voltage to a fixed predetermined voltage.

8. The data storage device of claim 1,
wherein the controller circuitry includes a memory interface, a processor, and a controller memory, the memory interface being connected to the NAND flash memory, the processor and the controller memory being connected to each other and to the memory interface; and
wherein the controller circuitry is configured to:
determine the last written word line of the memory block by accessing a last-written-word-line record stored in the controller memory or by querying the NAND flash memory through the memory interface; and
cause the non-selected word line voltage to be applied to non-selected word lines of the memory block by sending a control signal to the NAND flash memory through the memory interface or by directly applying the non-selected word line voltage to the non-selected word lines of the memory block.

9. A method performed by a controller coupled to a non-volatile memory, the method comprising:
determining a last written word line of a memory block included in the non-volatile memory, the memory block including a plurality of word lines that are written sequentially from a first end of the memory block to a second end of the memory block;
setting a non-selected word line voltage based on a position of the last written word line between the first end and the second end of the memory block; and
applying the non-selected word line voltage to non-selected word lines of the memory block.

10. The method of claim 9, wherein said setting the non-selected word line voltage based on the position of the last written word line of the memory block includes:
setting the non-selected word line voltage to a first predetermined voltage when the last written word line of the memory block is positioned between the second end of the memory block and a first predetermined word line of the memory block, setting the non-selected word line voltage to a second predetermined voltage when the last written word line of the memory block is positioned between the first predetermined word line of the memory block and a second predetermined word line of the memory block, and setting the non-selected word line voltage to a third predetermined voltage when the last written word line of the memory block is positioned between the second predetermined word line of the memory block and the first end of the memory block, wherein the second predetermined voltage is less than the first predetermined voltage, and wherein the third predetermined voltage is less than the second predetermined voltage.

11. The method of claim 9, further comprising decreasing the non- selected word line voltage by a predetermined amount when a program-erase cycle count of the memory block is less than a threshold.

12. The method of claim 9, further comprising decreasing the non- selected word line voltage by a predetermined amount when a temperature of the memory block is greater than a threshold.

13. The method of claim 9, wherein said setting the non-selected word line voltage based on the position of the last written word line of the memory block further includes setting the non-selected word line voltage based at least in part on a predetermined monotonic relationship between the non-selected word line voltage and the position of the last written word line of the memory block.

14. The method of claim 9, wherein the non-selected word line voltage is a non-selected programmed word line voltage, wherein the method further comprising:

applying the non-selected programmed word line voltage to non-selected word lines of the memory block positioned between the first end of the memory block and the last written word line of the memory block; and applying a non-selected erased word line voltage to non-selected word lines of the memory block positioned between the last written word line of the memory block and the second end of the memory block, wherein the non-selected erased word line voltage is less than the non-selected programmed word line voltage.

15. The method of claim 14, wherein the non-selected erased word line voltage is a fixed predetermined voltage.

16. An apparatus, comprising:

means for determining a last written word line of a memory block included in a NAND flash memory, the memory block including a plurality of word lines that are written sequentially from a first end of the memory block to a second end of the memory block;

means for setting a non-selected word line voltage based on a position of the last written word line between the first end and the second end of the memory block; and means for applying the non-selected word line voltage to non-selected word lines of the memory block.

17. The apparatus of claim 16, wherein the means for the setting the non-selected word line voltage based on the position of the last written word line of the memory block is configured to:

set the non-selected word line voltage to a first predetermined voltage when the last written word line of the memory block is positioned between the second end of the memory block and a first predetermined word line of the memory block, set the non-selected word line voltage to a second predetermined voltage when the last written word line of the memory block is positioned between the first predetermined word line of the memory block and a second predetermined word line of the memory block, and set the non-selected word line voltage to a third predetermined voltage when the last written word line of the memory block is positioned between the second predetermined word line of the memory block and the first end of the memory block, wherein the second predetermined voltage is less than the first predetermined voltage, and wherein the third predetermined voltage is less than the second predetermined voltage.

18. The apparatus of claim 16, further comprising means for decreasing the non-selected word line voltage by a predetermined amount when a program- erase cycle count of the memory block is less than a threshold.

19. The apparatus of claim 16, further comprising means for decreasing the non-selected word line voltage by a predetermined amount when a temperature of the memory block is greater than a threshold.

20. The apparatus of claim 16, further comprising means for the setting the non-selected word line voltage based at least in part on a predetermined monotonic relationship between the non-selected word line voltage and the position of the last written word line of the memory block.

21. The apparatus of claim 16, wherein the non-selected word line voltage is a non-selected programmed word line voltage, and wherein the apparatus further comprises:

means for applying the non-selected programmed word line voltage to non-selected word lines of the memory block positioned between the first end of the memory block and the last written word line of the memory block; and means for applying a non-selected erased word line voltage to non-selected word lines of the memory block positioned between the last written word line of the memory block and the second end of the memory block, and wherein the non-selected erased word line voltage is less than the non-selected programmed word line voltage.

22. The apparatus of claim 16, wherein the apparatus comprises a controller including a memory interface, a processor, and a controller memory, the memory interface being connected to the NAND flash memory, the processor and the controller memory being connected to each other and to the memory interface;

wherein the means for determining is configured to determine the last written word line of the memory block by accessing a last-written-word-line record stored in the controller memory or by querying the NAND flash memory through the memory interface; and wherein the means for applying the non-selected word line voltage is configured to cause the non-selected word line voltage to be applied to the non-selected word lines of the memory block by sending a control signal to the NAND flash memory through the memory interface or by directly applying the non-selected word line voltage to the non-selected word lines of the memory block.

* * * * *